(12) United States Patent
Chiang (10) Patent No.: US 6,779,595 B1
(45) Date of Patent: Aug. 24, 2004

(54) INTEGRATED HEAT DISSIPATION APPARATUS

(75) Inventor: Tsai Liang Chiang, Taipei (TW)

(73) Assignee: Cpumate Inc., Taipei (TW)

( * ) Notice: Subject to any disclaimer, the term of this patent is extended or adjusted under 35 U.S.C. 154(b) by 0 days.

(21) Appl. No.: 10/662,312

(22) Filed: Sep. 16, 2003

(51) Int. Cl.[7] .............................................. H05K 7/20
(52) U.S. Cl. ........................... 165/104.33; 165/104.26; 165/121; 165/185; 361/697; 361/700
(58) Field of Search ...................... 165/80.3, 104.21, 165/104.26, 121, 185, 104.33; 361/697, 700

(56) References Cited

U.S. PATENT DOCUMENTS

| | | | | |
|---|---|---|---|---|
| 5,216,580 A | * | 6/1993 | Davidson et al. | 361/700 |
| 5,959,837 A | * | 9/1999 | Yu | 361/697 |
| 6,102,110 A | * | 8/2000 | Julien et al. | 165/104.33 |
| 6,122,169 A | * | 9/2000 | Liu et al. | 361/700 |
| 6,125,035 A | * | 9/2000 | Hood et al. | 361/687 |
| 6,212,074 B1 | * | 4/2001 | Gonsalves et al. | 361/717 |
| 6,625,021 B1 | * | 9/2003 | Lofland et al. | 361/697 |

FOREIGN PATENT DOCUMENTS

JP           03096260 A  *  4/1991   ......... H01L/23/427

* cited by examiner

Primary Examiner—Allen J. Flanigan (57) ABSTRACT

An integrated heat dissipation apparatus, having a first heat dissipating element, a second heat dissipating element, a thermal conductive heat sink and at least one L-shape heat pipe. The thermal conductive heat sink has a connecting surface and a thermal conductive surface opposing the connecting surface. The first heat dissipating element is mounted on the thermal conductive surface. A plurality of thermal conductors with thermal conductivity larger than that of the thermal conductive heat sink are mounted to the connecting surface. The L-shape heat pipe has two ends, including one end serial connecting to the second heat dissipating element, and the other end extending to connect with the thermal conductors on the thermal conductive heat sink.

10 Claims, 9 Drawing Sheets

INTEGRATED HEAT DISSIPATION APPARATUS

BACKGROUND OF THE INVENTION

The present invention relates to an integrated heat dissipation apparatus and, more particularly, to an integrated heat dissipation apparatus combining heat pipe technique to effectively dissipate heat generated by heat generating electronic devices, such that the heat generating electronic devices can operate normally under a uniform and constant temperature.

The enhancement of computer industry has developed various kinds of high-precision electronic devices. With the technique advancement of the electronic devices, functionalities and operation speed are continuously improved; and consequently, a great amount of heat is generated thereby. Therefore, how to effectively dissipate heat generated by these high-precision electronic devices has become a major topics for research and development people in the industry.

Figure 1:
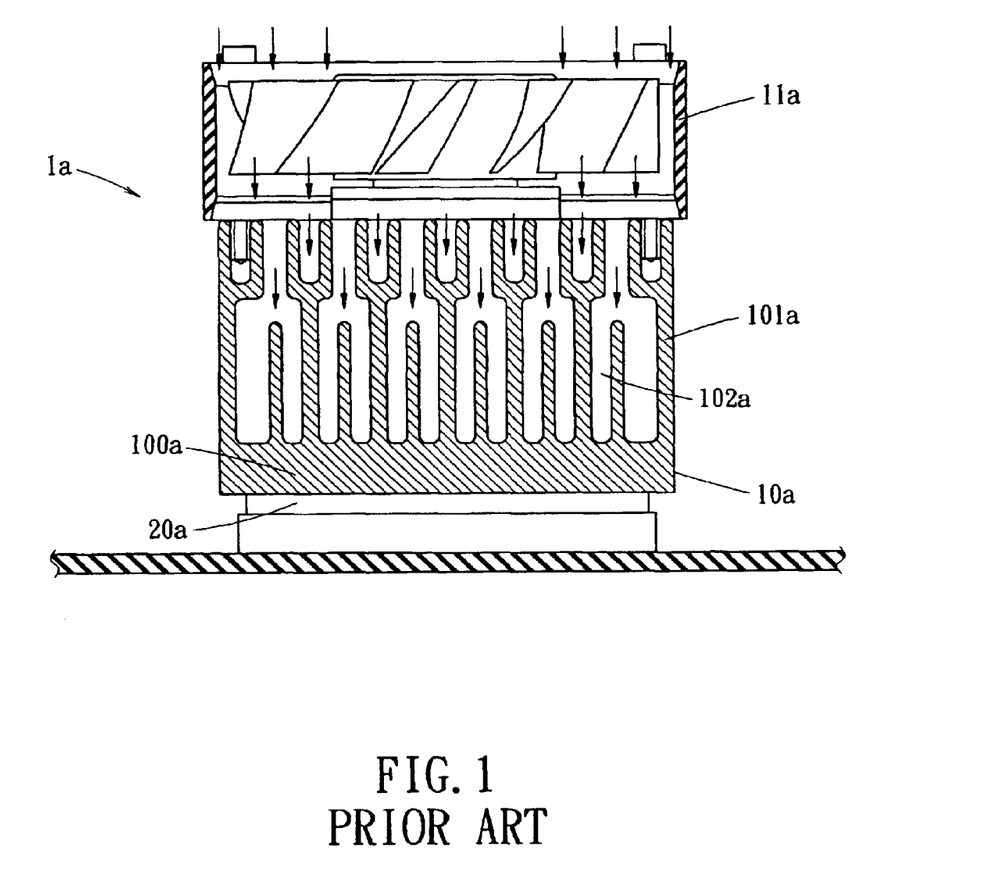
FIG. 1 is a cross sectional view of a conventional heat dissipation apparatus.

FIG. 1 shows a conventional heat dissipation apparatus 1a, which is mounted on heat generating electronic device such as a central processing unit (CPU) 2a. The heat dissipation apparatus 1a includes a heat sink 10a and a fan 11a mounted on the heat sink 10a. The heat sink 10a includes a substrate 100a attached to an upper surface of the central processing unit 2a. A plurality of fins 101a is formed on the substrate 100a. A channel 102a is formed between every pair of neighboring fins 101a for accommodating the heat flow generated by the central processing unit 2a. The fan 11a is used to blow a cool air flow into the channels 102a, such that the heat flow accumulated in the channels 102a can be cooled down and circulated. Therefore, the central processing unit 2a can operate normally under an allowable temperature.

The above heat dissipation apparatus 1a expels heat generated by the central processing unit 2a by a conventional way, that is, the heat is absorbed by the heat sink 10a and the heat flow generated thereby is accumulated in the channels 102a before being dissipated. For those electronic devices of which the generated heat is greatly increased, such heat dissipation apparatus cannot provide an instantaneous cooling effect and provides insufficient heat dissipation effect to the electronic devices.

BRIEF SUMMARY OF THE INVENTION

The present invention provides an integrated heat dissipation apparatus which uses a heat pipe connected to a thermal conductor to instantly dissipate heat generated by an electronic device to a distal end of the heat pipe. Therefore, the electronic device is remote from the dynamic heat generated thereby to prevent from affecting the normal functional operation thereof. In addition, two heat dissipating elements are incorporated to provide a primary path and a secondary path for heat dissipation. A fan is also used to generate a circulating air flow for dissipating the heat. Therefore, the electronic device can perform normal functional operation under a uniform and constant temperature.

The integrated heat dissipation apparatus provided by the present invention includes a first heat dissipating element, a second heat dissipating element, a thermal conductive heat sink, and at least one heat pipe. The heat sink includes a connecting surface and a thermal conductive surface opposing to the connecting surface. The first heat dissipating element is mounted to the thermal conductive surface, while the connecting surface further comprises a plurality of thermal conductors mounted thereon. The thermal conductors have thermal conductivity larger than that of the thermal conductive heat sink. The heat pipe has a first end serially connected to the second heat dissipation pipe and a second end extending to connect with the thermal conductors. Thereby, a majority portion of the heat can be carried by the heat pipe and dissipated by the second heat dissipating element, while the first heat dissipating element continues dissipating the remaining heat of the thermal conductive heat sink.

BRIEF DESCRIPTION OF THE DRAWINGS

These, as well as other features of the present invention, will become apparent upon reference to the drawings wherein.

DETAILED DESCRIPTION OF THE INVENTION

Figure 2:
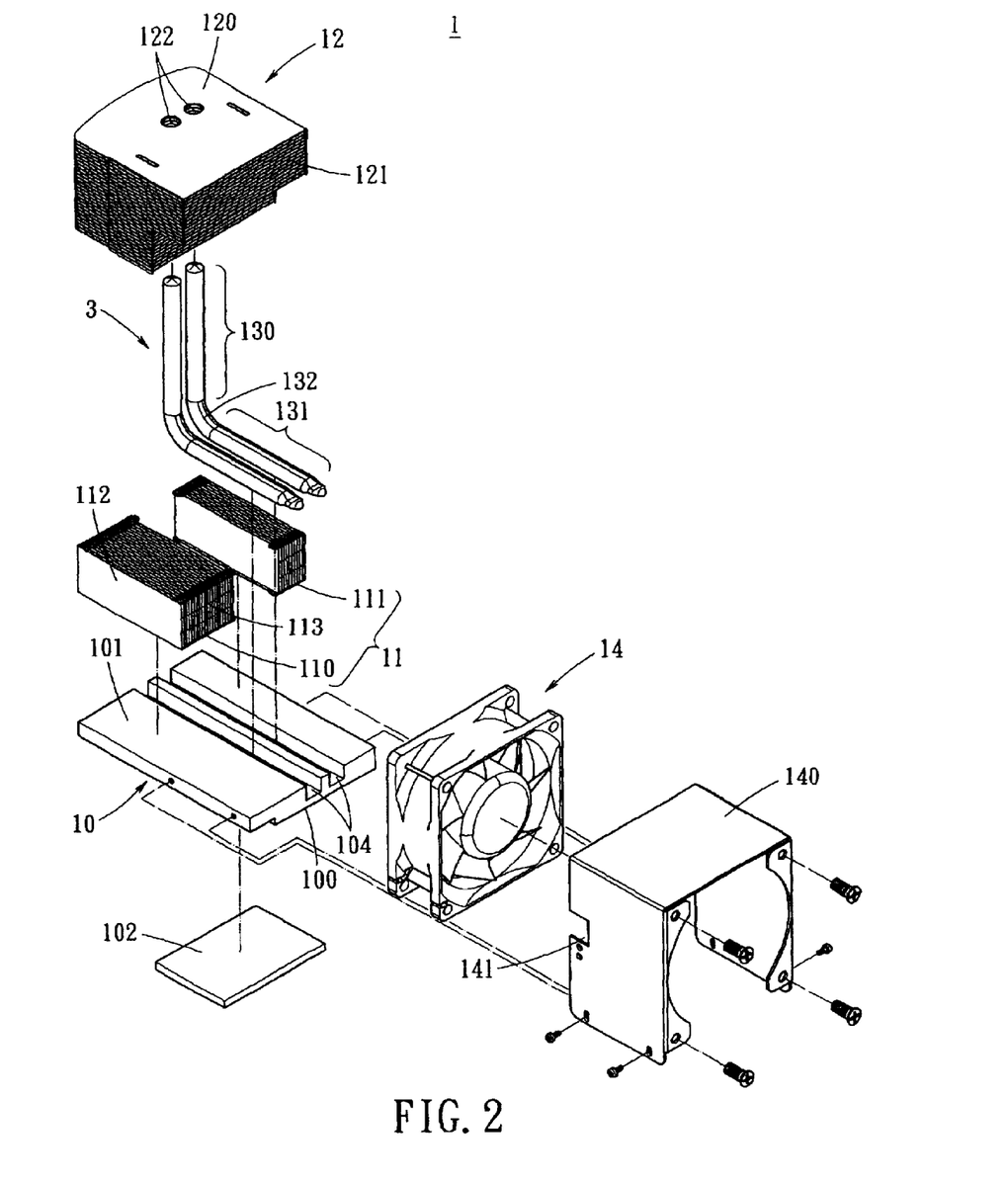
FIG. 2 is an exploded view of a heat dissipation apparatus provided by the present invention.
Figure 3:
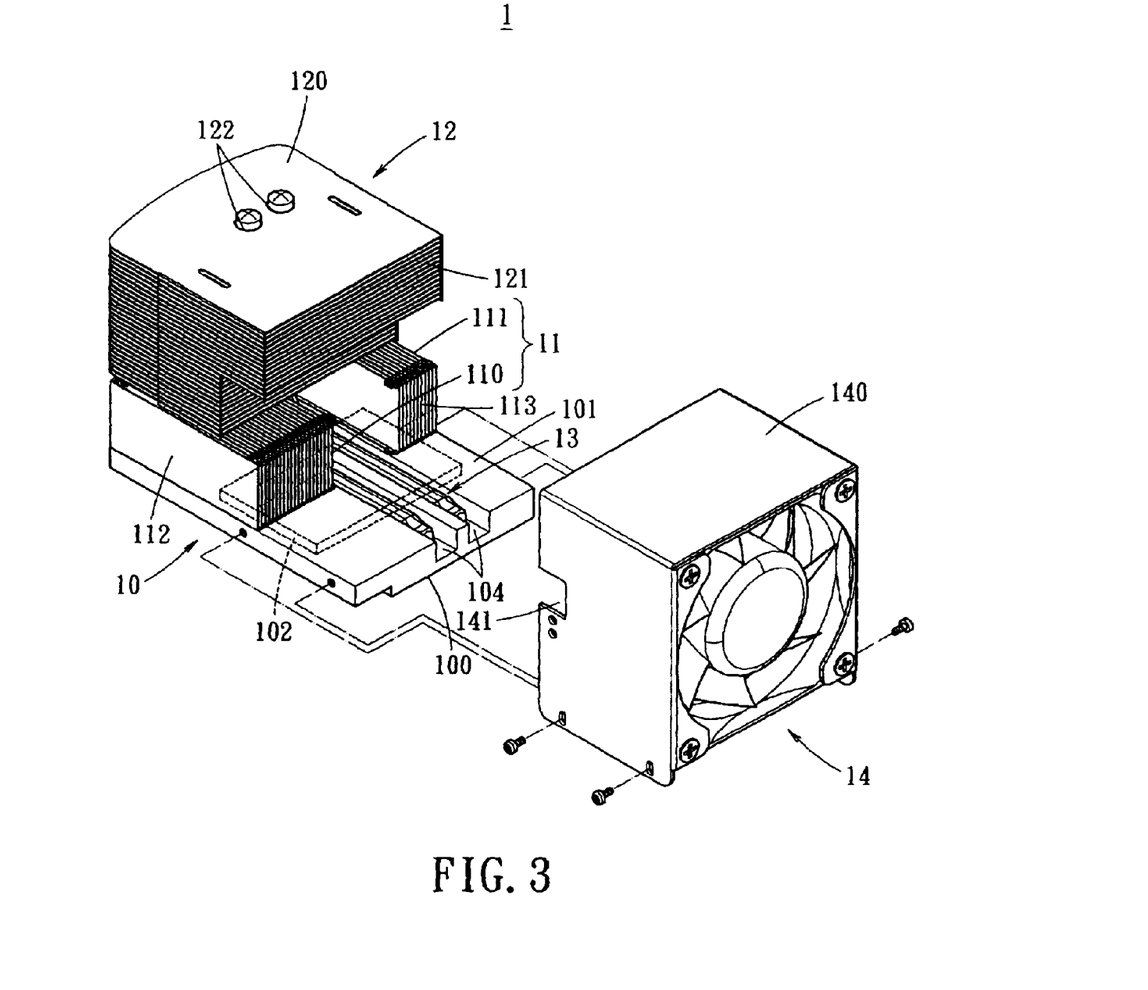
FIG. 3 shows an exploded view of a fan structure of the heat dissipation apparatus.
Figure 4:
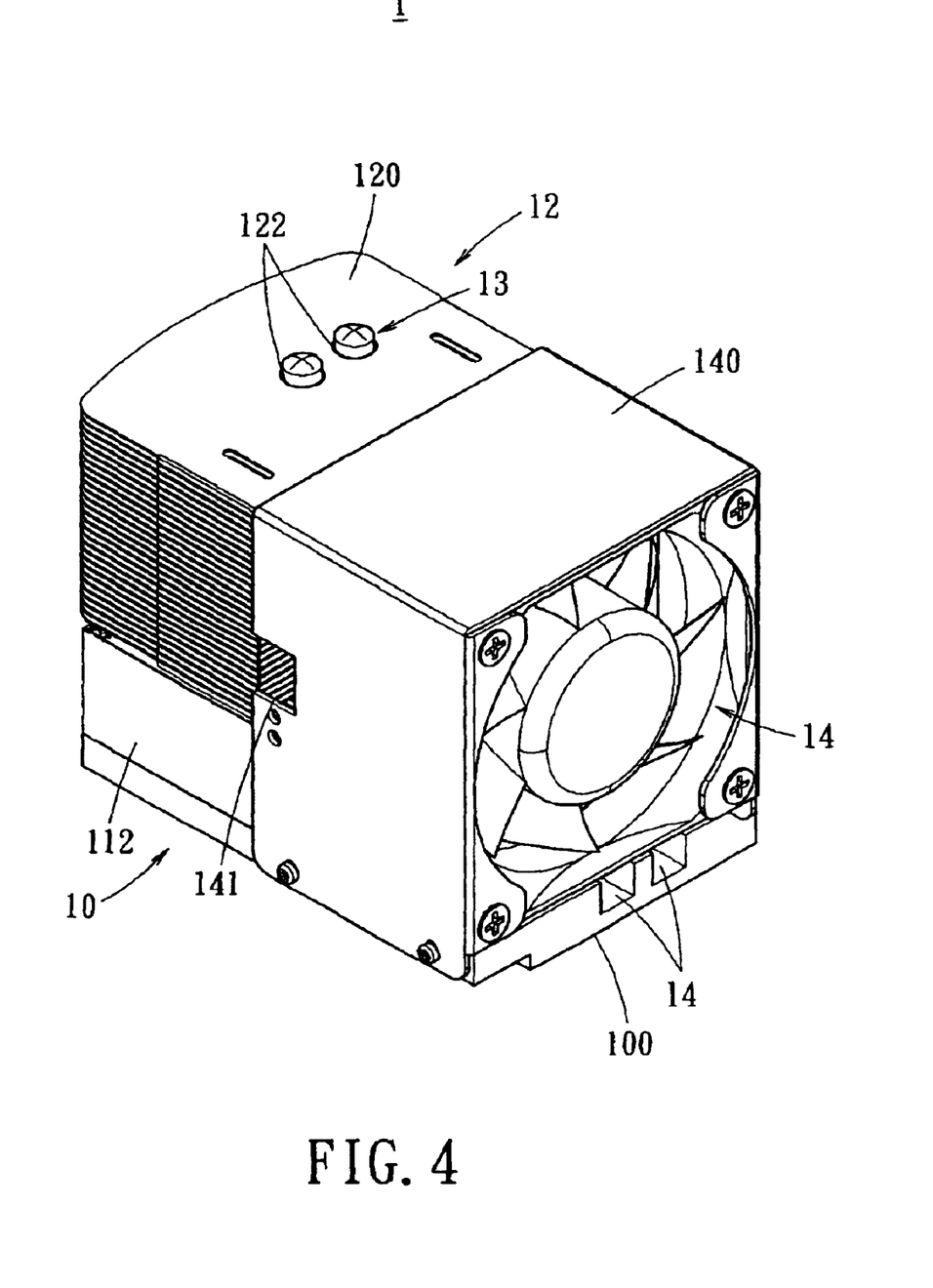
FIG. 4 shows an assembly of the heat dissipation apparatus.

Referring to FIGS. 2, 3 and 4, an exploded view of a heat dissipation apparatus provided by the present invention, an exploded view of a fan of the heat dissipation apparatus, and a perspective of an assembly of the heat dissipation apparatus are respectively shown. The heat dissipation apparatus 1 comprises a thermal conductive heat sink 10, a first heat dissipation element 11, a second heat dissipation element 12, and at least one heat pipe 13.

The thermal conductive heat sink 10 is made of material with good conductivity such as aluminum. Preferably, the thermal conductive heat sink 10 is in the shape of a flat panel with a connecting surface 100 at the bottom and a thermal conductive surface 101 at the top. The connecting surface 100 comprises a plurality of thermal conductors 102 formed thereon. The thermal conductivity coefficient of the thermal conductors 102 is larger than that of the thermal conductive heat sink 10. As shown in FIG. 3, a slot 103 is recessed from the connecting surface 100 for accommodating the conductor 102 therein. Recessed from the thermal conductive surface 101 is a slot 104 for embedding the heat pipe 13 therein. The slot 104 is aligned over the recess 103 to provide a communication channel between the connecting surface 100 and the thermal conductive surface 101.

Figure 5:
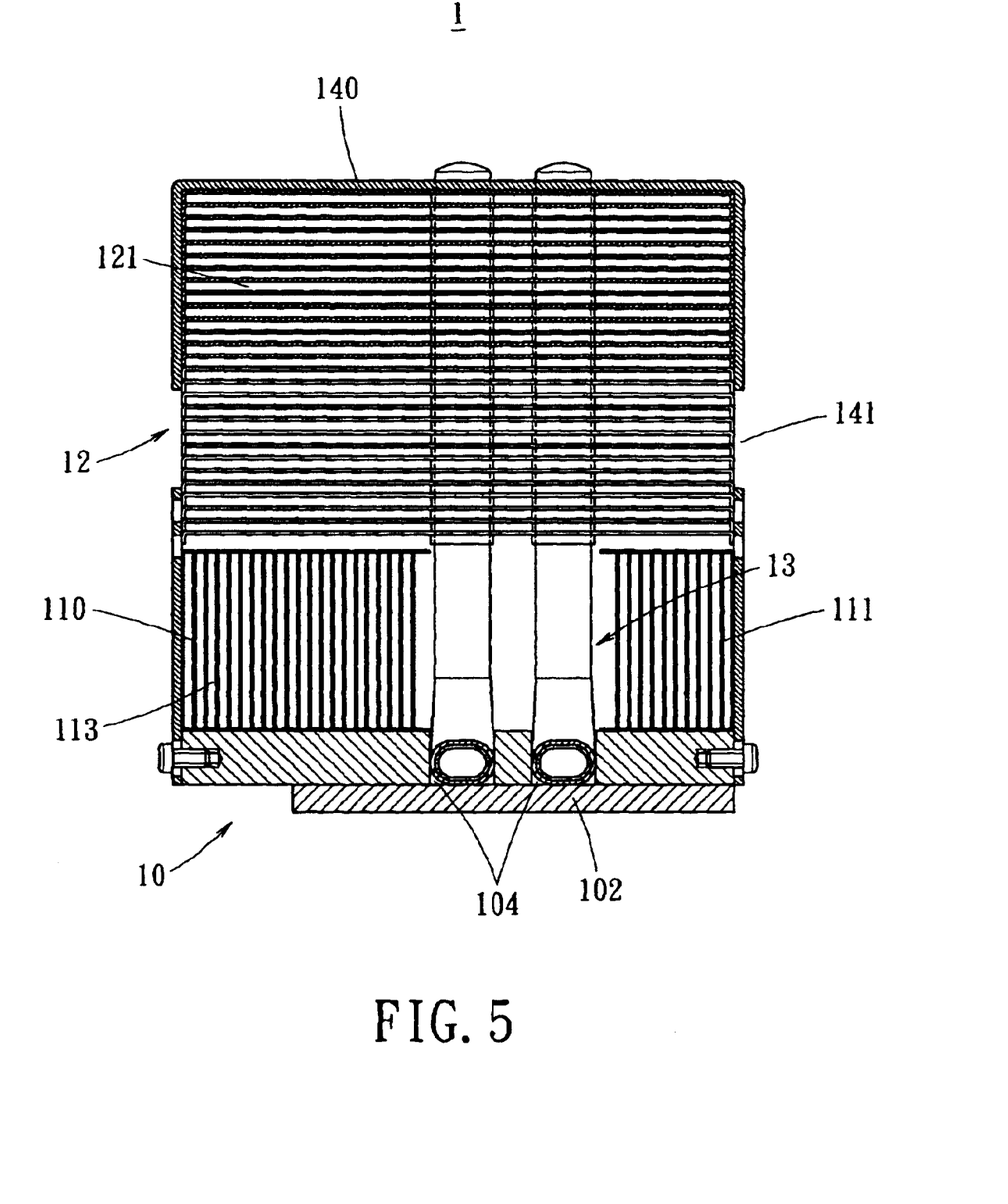
FIG. 5 shows a cross sectional view of the assembly.

The first heat dissipating element 11 is mounted to the thermal conductive surface 101 of the thermal conductive heat sink 10. By thermal conductive glue or other thermal conductive soldering medium such as tin, the first heat dissipating element 11 is adhered or soldered to the thermal conductive surface 101. In this embodiment, the first heat dissipating element 11 comprises two sets of fins 110 and 111 extending along two elongate sides of the slot 104 (as shown in FIG. 5). That is, the above heat pipe 13 is arranged between the sets of fins 110 and 111. Each of the sets of fins 110 and 111 includes a plurality of fins 112 spaced from and snapped with each other, such that channels 113 are formed between neighboring fins 112 for circulating heat flow. The fins 112 are arranged perpendicular to the thermal conductive surface 101. Preferably, the fins 112 can be formed integrally with the thermal conductive heat sink 10.

The second heat dissipating element 12 also comprises a plurality of fins 120 spaced from and snapped with each other, such that channels 121 are formed between neighboring fins 120. Each of the fin 120 is perforated with through holes 122, and the number of these through holes 122 is consistent with the number of the heat pipe 13.

The first and second beat dissipating elements 11 and 12 can be made of thermal conductive material such as copper and aluminum. If the first heat dissipating element 11 is formed integrally with the thermal conductive heat sink 10, aluminum can also be used for forming the first heat dissipating element 11.

The heat pipe 13 is preferably bent with an L shape with two terminal ends 130 and 131, and the bent tube 132 extending between these two terminal ends 130 and 131. The terminal end 130 of the heat pipe 13 is inserted through the through holes 122 of the fins 120 of the second heat dissipating element 12 to maintain a good thermal conduction between the fins 120 and the heat pipe 13. The other terminal end 131 of the heat pipe 13 extends towards the thermal conductor 102 on the thermal conductive heat sink 10. In this embodiment, as the slot 104 is located on and communicated with the slot 103, the thermal pipe 13 and the thermal conductor 102 are in contact with each other to provide a direct thermal conduction.

The heat dissipation apparatus provided by the present invention further comprises a fan 14 installed at one side of the thermal conductive heat sink 10. The fan 14 is operative to generate an air flow upon the channels 113 and 121 of the first and second heat dissipation elements 11 and 12, respectively. Therefore, the heat accumulated in the channels 113 and 121 can thus be circulated and removed alone with the air flow. A wind mask 140 can also be disposed at a periphery of the fan 14. The wind mask 140 is connected across one side of the thermal conductive heat sink 10. With the first heat dissipation element 11 located at the other side of the thermal conductive heat sink 10, the wind mask 140 faces the first and second heat dissipating elements 11 and 12 (FIG. 6), such that the air flow generated by the fan 14 can be guided to the first and second heat dissipating elements 11 and 12 through the wind mask 140 to enhance heat dissipation effect.

According to the above, an integrated heat dissipation apparatus is obtained.

Figure 7:
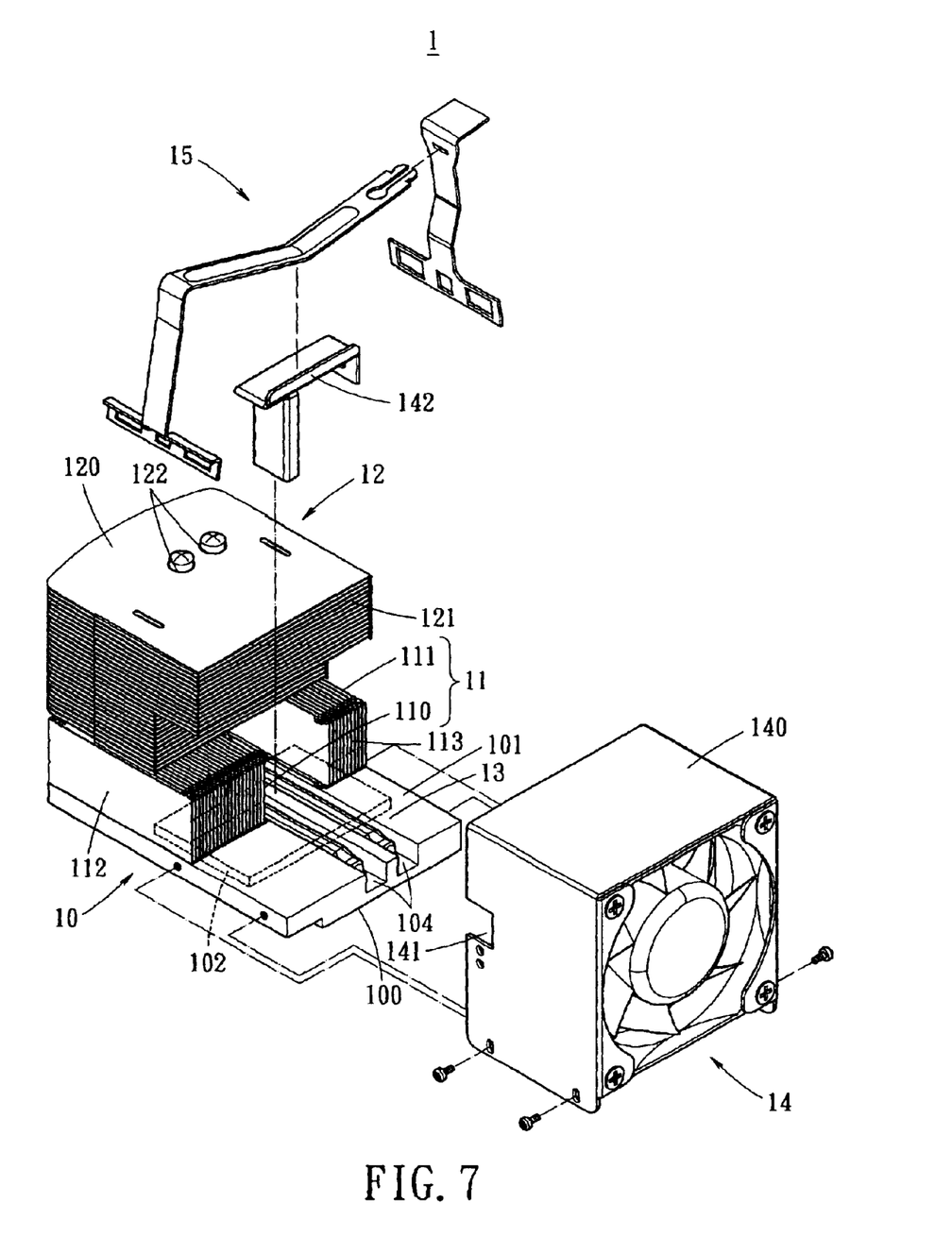
FIG. 7 shows a perspective exploded view of a fastening tool of the heat dissipation apparatus.
Figure 8:
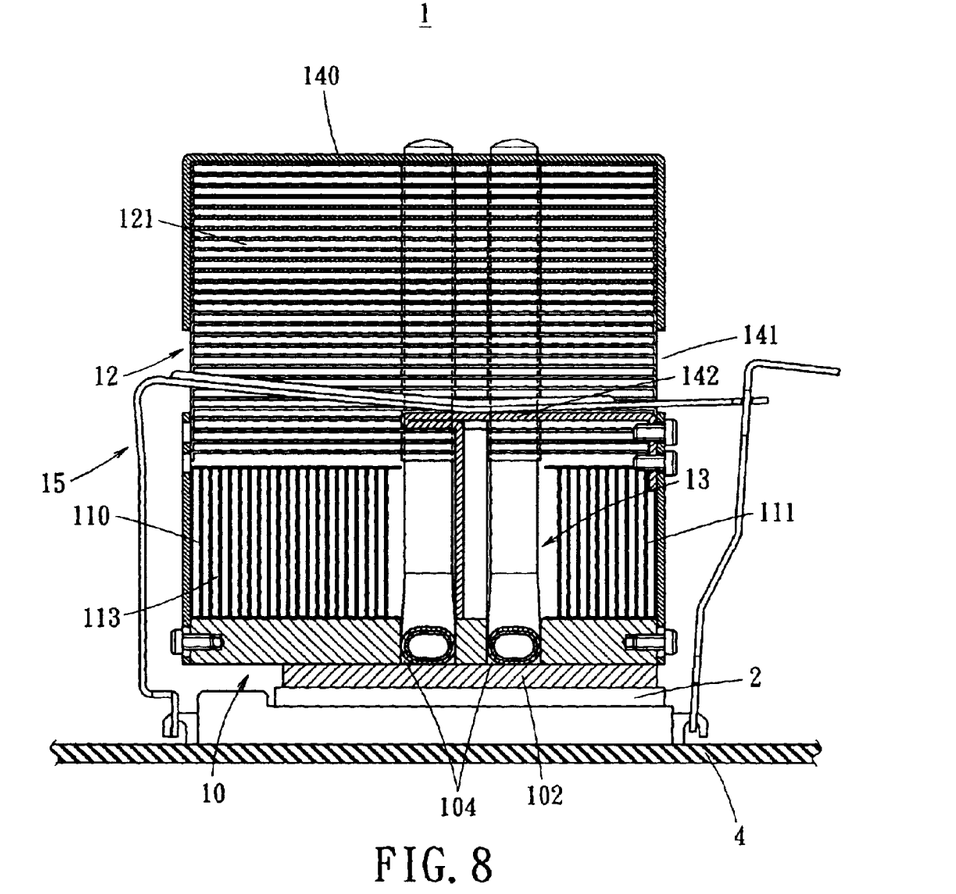
FIG. 8 shows a cross sectional view of applying the heat dissipation apparatus to an electronic device.

Referring to FIGS. 7 and 8, in the practical application of the heat dissipation apparatus 1, a fastening member 15 can be used to attach the heat dissipation apparatus 1 to a motherboard 4. The fastening member 15 is engaged on the central processing unit slot 3 of the motherboard 4. In this embodiment, a central processing unit 2 is installed in the central processing unit slot 3, such that the fastening member 15 is pressed engaged upon the central processing unit 2. Thereby, the bottom surface of the thermal conductor 102 is in contact with the top surface of the central processing unit 2.

Figure 6:
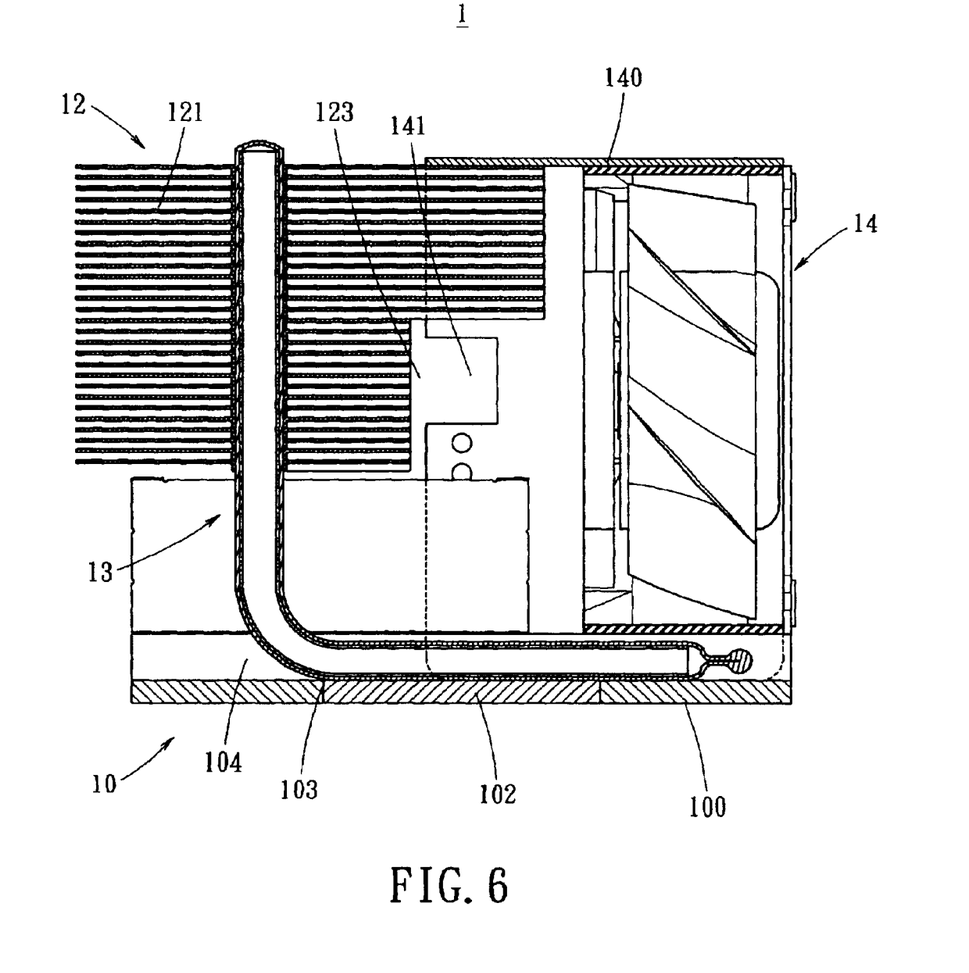
FIG. 6 shows a cross sectional view of the assembly from another viewing angle.

The fastening member 15 can also be engaged with the heat apparatus 1. In this case, the fins 120 at the lower part of the second heat dissipating element 12 are shorter than the fins 120 at the upper part of the second heat dissipating element 12 to form an installation space 123 (FIG. 6). The above wind mask 140 further comprises an opening 141 near the first and second heat dissipating elements 11 and 12. The opening 141 is aligned with the installation space 123, such that the fastening member 15 is inserted into the opening 141 and entering the installation space 123, followed by being pressed upon the central processing unit 2.

To avoid damaging the fins 112 and 120 of the first and second heat dissipating elements 11 and 12 by pressing the fastening member 15 upon the heat dissipation apparatus, a supporting member 142 can be formed between the sets of fins 10 and 111. The supporting member 142 has one side locked with the interior wall of the wind mask 140, allowing the fastening member 15 to be pressed thereupon. Therefore, the fins 112 and 120 are prevented from being the objects to which the pressing force of the fastening member 15 is applied.

Figure 9:
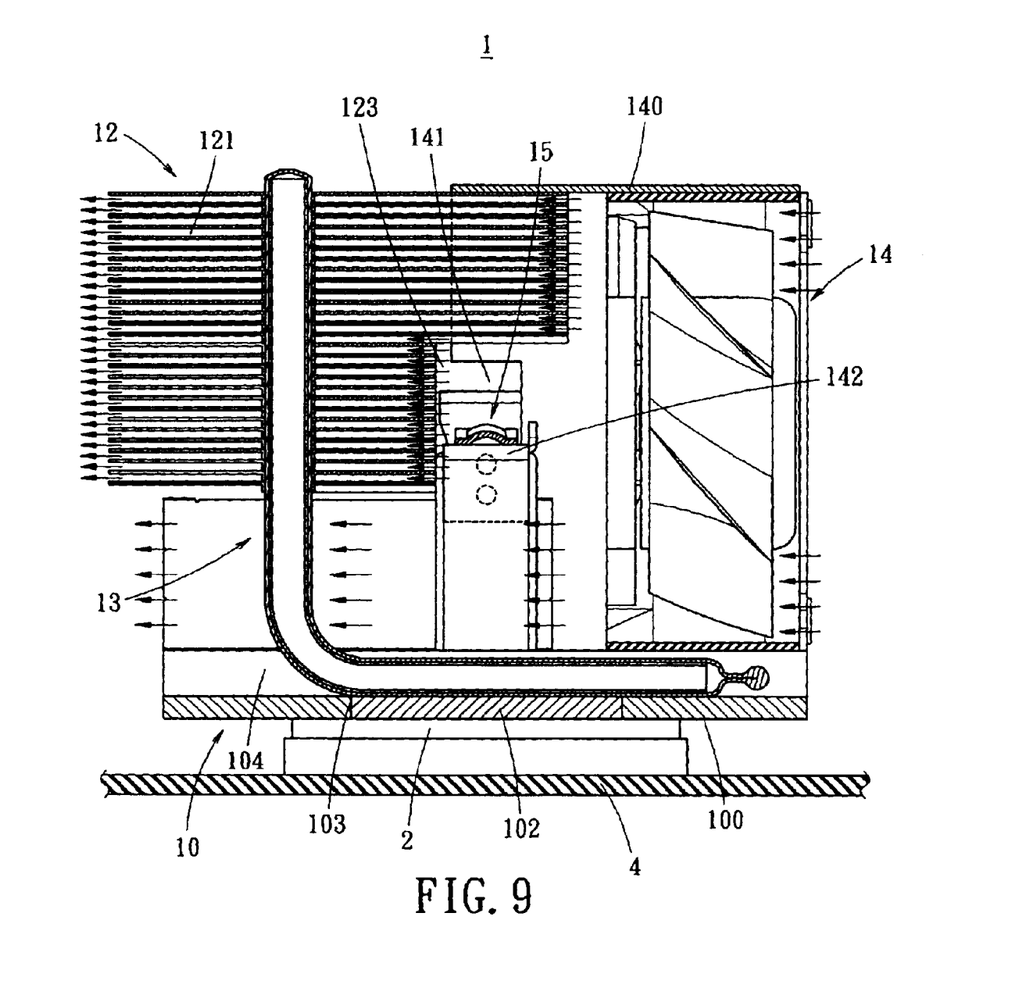
FIG. 9 shows a cross sectional view of the application from another viewing angle.

Accordingly, referring to FIG. 9, when the central processing unit 2 starts operating, a majority of heat generated thereby is guided by the heat pipe 13 towards the second heat dissipating element 12. Therefore, the central processing unit 2 can be instantly cooled down, while the residual heat remaining in the thermal conductive heat sink 10 is dissipated with the aid of the first heat dissipating element 11. Therefore, the heat generated by the central processing unit 2 can be dissipated or exhausted instantly, and the temperature of the central processing unit 2 is kept uniform and constant. Further, the heat guided to the first and second heat dissipating elements 11 and 13 are accumulated in the channels 113 and 121. By the air flow generated by the fan 14, the accumulated heat can be exhausted out of the channels 113 and 121, such that additional heat can be accumulated in the first and second heat dissipating elements 11 and 12.

This disclosure provides exemplary embodiments of the present invention. The scope of this disclosure is not limited by these exemplary embodiments. Numerous variations, whether explicitly provided for by the specification or implied by the specification, such as variations in shape, structure dimension, type of material or manufacturing process may be implemented by one of skill in the art in view of this disclosure.

What is claimed:

1. An integrated heat dissipation apparatus, comprising:
   a first heat dissipating element;
   a second heat dissipating element;
   a thermal conductive heat sink, having a connecting surface and a thermal conductive surface opposing to the connecting surface, wherein the first heat dissipating element is mounted on the thermal conductive surface;
   a thermal conductor mounted to the connecting surface, wherein the thermal conductor has a thermal conductive coefficient larger than that of the thermal conductive heat sink; and
   at least one heat pipe with two terminal ends, wherein one terminal end is serially connected to the second heat dissipating element, and the other terminal end extends to connect with the thermal conductor.

2. The apparatus according to claim 1, wherein the connecting surface comprises a slot recessed therefrom for accommodating the thermal conductor therein.

3. The apparatus according to claim 1, wherein the thermal conductive surface comprises a slot recessed therefrom for embedding the other terminal end of the heat pipe therein.

4. The apparatus according to claim 1, wherein the connecting surface comprises a slot recessed therefrom for accommodating the thermal conductor therein, the thermal conductive surface comprises a slot recessed therefrom for embedding the other terminal end of the heat pipe therein, and the slot recessed from the thermal conductive surface is aligned and communicated with the slot recessed from the connecting surface, such that the heat pipe is in contact with the thermal conductor.

5. The apparatus according to claim 1, wherein the first heat dissipating element comprises two sets of fins located along two elongate sides of the heat pipe.

6. The apparatus according to claim 1, wherein the heat pipe further comprises a bent tube extending between the terminal ends.

7. The apparatus according to claim 1, further comprising a fan installed at one side of the thermal conductive heat sink.

8. The apparatus according to claim 7, wherein the fan further comprises a wind mask connected across one side of the thermal conductive heat sink, such that the first heat dissipating element is located at an opposing side of the thermal conductive heat sink allowing the fan to face towards the first and second heat dissipating elements.

9. The apparatus according to claim 8, further comprising a fastening member, the second heat dissipating element including a receiving space, and the wind mask including openings near the first and second heat dissipating elements, wherein the opening is aligned with the receiving space allowing the fastening member to be inserted into the opening and the receiving space.

10. The apparatus according to claim 9, further comprising a supporting member, wherein one end of the supporting member is locked with an interior wall of the wind mask, such that the fastening member is pressed on the supporting member.

* * * * *